(12) United States Patent
Courselle et al.

(10) Patent No.: US 8,598,963 B2
(45) Date of Patent: Dec. 3, 2013

(54) CONNECTOR FOR ELECTRONIC ASSEMBLIES THAT SCREENS AND DOES NOT REQUIRE SOLDERING

(75) Inventors: Laurent Courselle, Toulouse (FR); Serge Tonus, Leguevin (FR); Céline Frinault, Castanet Tolosan (FR); Cécile Debarge, Toulouse (FR); Abdelmounaim Riad, Villaudric (FR); Philippe Monfraix, Castanet Tolosan (FR)

(73) Assignee: Thales, Neuilly-sur-Seine (FR)

( * ) Notice: Subject to any disclaimer, the term of this patent is extended or adjusted under 35 U.S.C. 154(b) by 339 days.

(21) Appl. No.: 13/175,592

(22) Filed: Jul. 1, 2011

(65) Prior Publication Data

US 2012/0008298 A1    Jan. 12, 2012

(30) Foreign Application Priority Data

Jul. 6, 2010    (FR) ...................... 10 02836

(51) Int. Cl.
*H03H 2/00*    (2006.01)
(52) U.S. Cl.
USPC ........................ 333/24 R; 333/260
(58) Field of Classification Search
USPC ................ 333/24 R, 260; 439/66, 63, 91
See application file for complete search history.

(56) References Cited

U.S. PATENT DOCUMENTS 5,675,302 A * 10/1997 Howard et al. ............... 333/243
6,094,115 A * 7/2000 Nguyen et al. ............... 333/260
7,501,584 B2 * 3/2009 Hashimoto et al. ........... 174/259
2007/0184681 A1   8/2007 Tutt et al.
2008/0139017 A1   6/2008 Kiyofuji et al.
2010/0327933 A1  12/2010 Ibert et al.

FOREIGN PATENT DOCUMENTS

| | | |
|---|---|---|
| EP | 1950849 A2 | 7/2008 |
| FR | 2801433 A1 | 5/2001 |
| WO | 01/57967 A1 | 8/2001 |

OTHER PUBLICATIONS

Hypertac: "RX Hyperstac, Z-Axis Signal Connectors," Apr. 2005, pp. 193-194.
CIN::APSE: "High Speed Interconnect Technology," by Cinch, pp. 1-2-1-4.

* cited by examiner

*Primary Examiner* — Robert Pascal
*Assistant Examiner* — Kimberly Glenn
(74) *Attorney, Agent, or Firm* — Baker & Hostetler LLP

(57) ABSTRACT

A device interconnects two circuit boards each comprising electrical connection pads, and which are respectively placed in two cavities. The device includes intercavity microwave screening means. The device also comprises several electrical conductors that pass through the device from end to end and that are not soldered, the two ends of which conductors are respectively intended to make direct contact with the connection pads of the two circuit boards; and mechanical means for holding the two circuit boards against the device, at either end of the latter. The screening means are provided by a microwave absorber in contact with each conductor and surrounding it over all or some of its length.

7 Claims, 3 Drawing Sheets

CONNECTOR FOR ELECTRONIC ASSEMBLIES THAT SCREENS AND DOES NOT REQUIRE SOLDERING

CROSS-REFERENCE TO RELATED APPLICATIONS

This application claims priority to foreign French patent application No. FR 10 02836, filed on Jul 6, 2010, the disclosure of which is incorporated by reference in its entirety.

FIELD OF THE INVENTION

The field of the invention is that of the interconnection of two circuit boards of an active RF system, such as those carried by the payload of a satellite. These boards are each placed in a cavity and it is necessary to screen these cavities so as to prevent one card interfering electromagnetically with the other.

BACKGROUND OF THE INVENTION

Figure 1:
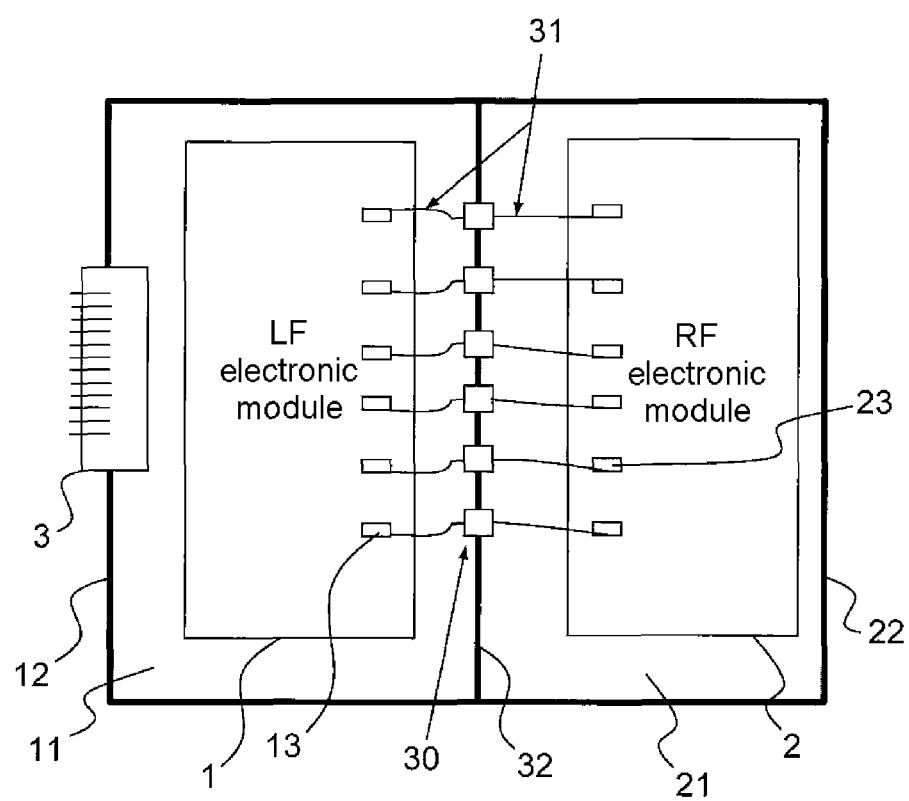

To obtain a robust partition of the various internal electronic functions of an active RF (radiofrequency) system, screening of about 90 dBi at frequencies higher than 1 GHz is targeted. The most commonly employed solution, an example of which is shown in FIG. 1, consists in making this electrical interconnection using feedthrough filters. Each circuit board (or module) (an LF (low frequency) module 1 and an RF module 2 in this example) is secured in a cavity bounded by a metal partitioning structure. Feedthrough filters 30, also called feedthrough capacitors, are fitted, using adhesive bonding, into apertures provided in a partition 32 common to the two cavities 11 and 21. These feedthrough filters 30 are provided with RF seals. The connection pads 13, 23 of the circuit boards are connected to the feedthroughs 30 using wires 31 which are soldered at their two ends. Each feedthrough filter 30 ensures the electrical connection of one signal. Therefore, as many feedthrough filters as there are signals to be injected from one board into another are required. The capacitance and the RF seal of each feedthrough 30 ensure the EMC (electromagnetic compatibility) of the two cards. The element 3 is a supply connector which serves as an interface with the exterior and which therefore delivers LF signals generated outside of the system, which must transit the LF module 1 (in which they are processed) and finally supply the RF module 2 once processed.

These feedthrough filters therefore require manual bonding and wiring operations to produce the intermodule electrical connections. The RF screening requirement complicates the arrangement of the electronic modules and therefore the design of the mechanical structures housing them. Finally, without counting the increased cost of the structure, the unit cost of a feedthrough filter equipped with an RF seal is about € 100, to which a € 150 labour cost must be added.

The number of manual operations is furthermore multiplied by the number of signals to be injected (N feedthroughs are required to inject N signals), which is increasingly large. This is because there is a growing demand for systems fitted with high-added-value electronic modules which combine several functions on the same substrate.

Furthermore, it is impossible to inject signals rapidly due to filtering in the feedthroughs.

SUMMARY OF THE INVENTION

The aim of the invention is to obviate these drawbacks. Accordingly, there remains to this day a need for an interconnecting device meeting simultaneously all the aforementioned requirements, notably in terms of unit cost, labour cost, screening and signal-bussing capability.

More precisely, the subject of the invention is a device for interconnecting two circuit boards each comprising electrical connection pads, each board being intended to be placed in a different screened cavity. This device comprises intercavity microwave screening means and it is mainly characterized in that it comprises:

- several electrical conductors that pass through the device from end to end and that are not soldered, the two ends of which conductors are respectively intended to make direct contact with the connection pads of the two circuit boards; and
- mechanical means for holding the two circuit boards against the device, at either end of the latter;

and in that the screening means are provided by a microwave absorber in contact with each conductor and surrounding it over all or some of its length.

This LF interconnecting device provides a solution both to the problem of intercavity RF screening in an active system of a payload and simplifies the internal interconnections between two electronic subassemblies (board, package, etc.). This device also makes it possible to optimize the mechanical design of the system structures that are associated therewith and reduce cost notably by making the feedthrough filters and the associated soldered connections redundant.

Preferably, each electrical conductor comprises, between its two ends, means of pressing its ends towards the exterior of the device, so as to reinforce the electrical contact with the connection pads.

These pressing means are for example one or two electrically conductive magnets or mechanical springs placed between the ends.

The mechanical means for holding the two circuit boards may comprise one or more rods threaded with nuts or one or more screws.

It advantageously comprises, on a side intended to make contact with a wall bounding the cavities, an electromagnetic seal placed, preferably removably, in a groove of the device.

According to one feature of the invention, it comprises a resin for holding the conductors in the device.

According to another feature of the invention, the microwave absorber is effective at frequencies higher than 1 GHz.

BRIDF DESCRIPTION OF THE DRAWINGS

Figure 2A:
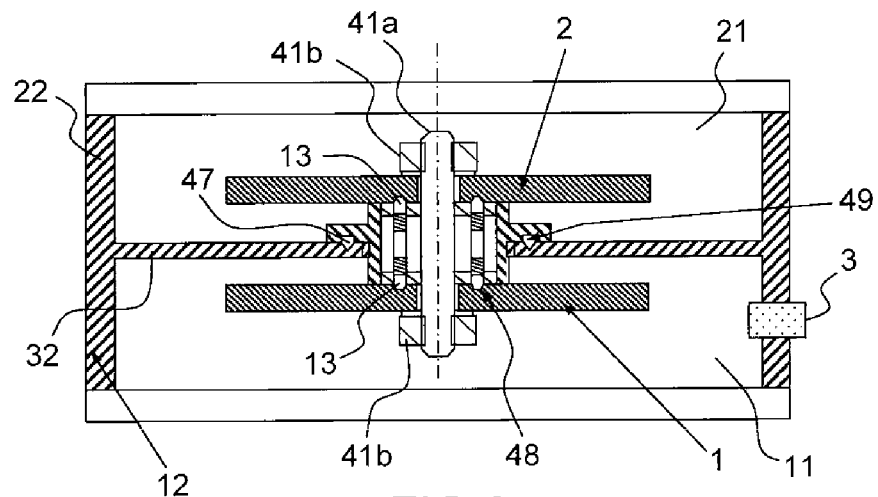
Figure 2B:
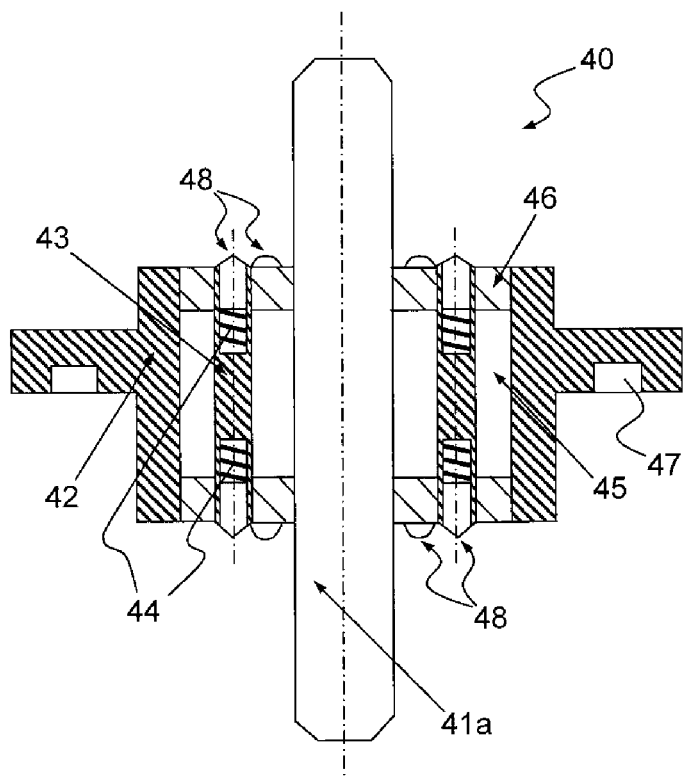
Figure 3A:
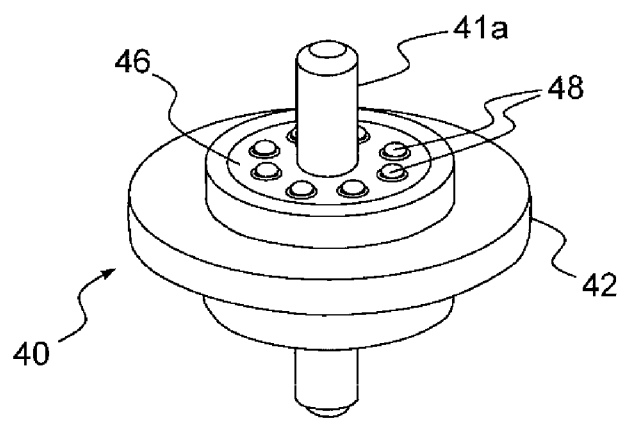
Figures 3B, 3C:
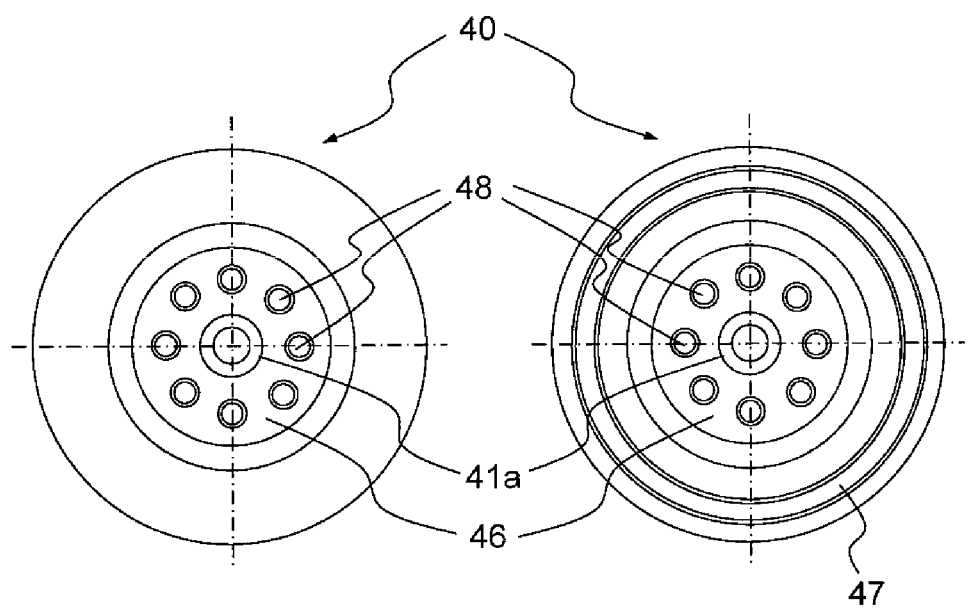

Other features and advantages of the invention will become clear on reading the following detailed description, given by way of non-limiting example and with reference to the appended drawings in which:

FIG. 1, described above, shows a schematic view of an exemplary prior-art interconnecting device;

FIGS. 2a and 2b show schematic cross-sectional views of an exemplary interconnecting device according to the invention (installed between two cavities (FIG. 2a) and a more detailed view (FIG. 2b)); and FIGS. 3a, 3b and 3c show a schematic perspective view (FIG. 3a), a schematic top view (FIG. 3b) and a schematic bottom view (FIG. 3c) of an exemplary, circular interconnecting device according to the invention, fitted with 8 conductive shafts.

In all these figures the same elements have been given the same references.

DETAILED DESCRIPTION

With regard to FIGS. 2a and 2b, a device for interconnecting two circuit boards, an LF board 1 and an RF board 2, each comprising electrical connection pads 13, is described. These boards are respectively placed in two cavities 11, 21 comprising metal partitions. The circuit boards that are intended to be connected are for example:

two printed circuit boards;

a printed circuit board and a macro-hybrid package (a macro-hybrid package being a hermetically sealed package in which an electronic circuit is integrated. It is the equivalent of the RF board 2 in FIG. 1 in the example here); and two ceramic boards.

The interconnecting device 40 comprises a metal structure or body 42 and mechanical means for holding the two electronic cards against the device, on either side of the latter. These are for example temporary holding means such as a threaded rod 41a (or several threaded rods) associated with nuts 41b, as shown in the figure. The boards could also be held by one or more screws. They may be placed in the centre of the device or in any other location (periphery, etc.).

The device also comprises several electrical conductors 48, also denoted conductive shafts, which pass right through the device from one side to the other, and that are not soldered. The two ends of each conductive shaft are intended, respectively, to make direct contact with the connection pads 13 of the two circuit boards held on either side of the interconnecting device, as indicated above. There are no longer any electrical wires to be soldered. These conductive shafts 48 are held in the device for example by means of a resin 46 which envelops part of their length; in the example in the figure the resin 46 envelops their ends. The resin is furthermore electrically insulating so as to isolate the ends of the conductors 48 from one another.

According to a preferred variant of the invention, each electrical conductor 48 comprises, between its two ends, means 44 for pressing the ends towards the connection pads. These means make it possible to press the ends onto the connection pads 13 and thus ensure the electrical connection even when strong vibrations are present, as is generally the case in a system carried onboard the payload of a satellite. These electrically conductive pressing means are for example a spring (or two springs), as shown in the figure. It is also possible for one or two magnets to be used.

The RF screening between cavities is provided by a microwave absorber 45 which makes contact with and surrounds each conductor 48 over its entire length or over part of its length. In the example in the figure, the absorber 45 surrounds the central part of each shaft. This absorber 45 is typically an absorbent epoxy resin, filled with steel particles.

An optionally removable EMC seal 49 is preferably placed on one side of the device, in contact with the wall 32 that bounds the two cavities. This seal 49, which is for example a silicon seal containing copper and silver particles, has the function of screening between the body 42 of the connecting device and the wall on which it is placed. This seal is advantageously placed in a groove 47 provided for this purpose, produced in the body 42 of the device.

The interconnection device 40 may be circular, as shown in the figures, but various geometries may be used to accommodate the arrangement of the connection pads on the circuit boards. Thus, for example, an interconnecting device such as shown in FIGS. 3a, 3b and 3c corresponds to circuit boards having connection pads (8 in the example in FIG. 3) that are also arranged in a circle.

The exemplary connection device according to the invention shown in the figures typically has the following dimensions:

external diameter: 160 mm;

thickness of the metal body: 6 mm; and length of the threaded rod: 160 mm.

An interconnecting device according to the present invention has the following advantages:

it dispenses with feedthrough filters, and the manual bonding and wiring operations associated therewith;

it simplifies the mechanical design of the bearing structures: fewer partitions and no need for kinked holes. It also makes a more optimal arrangement of the subassemblies possible by increasing the amount of space available;

it possibly meets an increasing demand for production of high-added-value subassemblies (glob-top boards, for example), where most of the signals are bussed via a single connector, since it is possible to bus as many signals as there are conductors, reducing the assembly cost; and it makes it possible to bus secondary supply bus signals and control signals without distortion because the invention does not filter signals having frequencies F below 1 GHz.

The invention claimed is:

1. A device for interconnecting two circuit boards each comprising electrical connection pads, each of the boards being intended to be placed in a different screened cavity, the device comprising; intercavity microwave screening means; several electrical conductors that pass through the device from end to end and that are not soldered, the two ends of the conductors respectively making direct contact with the connection pads of the two circuit boards; and mechanical means for holding the two circuit boards against the device, at either end of the latter, wherein the screening means are provided by a microwave absorber in contact with each of the conductors and surrounding each of the conductors over all or some of a length of each of the conductors.

2. The device according to claim 1, wherein each of the conductors comprises, between two ends of each of the conductors, means of pressing the two ends towards an exterior of the device, so as to reinforce the electrical contact with the connection pads.

3. The device according to claim 1, wherein the pressing means are one or two electrically conductive magnets or mechanical springs placed between the two ends.

4. The device according to claim 1, wherein the mechanical means for holding the two circuit boards comprise one or more rods threaded with nuts or one or more screws.

5. The device according to claim 1, further comprising:

on a side intended to make contact with a wall bounding the cavities, an electromagnetic seal placed, removably, in a groove of the device.

6. The device according to claim 1, further comprising:

a resin for holding the conductors in the device.

7. The device according to claim 1, wherein the microwave absorber is absorbent at frequencies higher than 1 GHz.

* * * * *